United States Patent
Hshieh

[19]

[11] Patent Number: 6,051,468
[45] Date of Patent: Apr. 18, 2000

[54] METHOD OF FORMING A SEMICONDUCTOR STRUCTURE WITH UNIFORM THRESHOLD VOLTAGE AND PUNCH-THROUGH TOLERANCE

[75] Inventor: Fwu-Iuan Hshieh, Saratoga, Calif.

[73] Assignee: MagePower Semiconductor Corp., San Jose, Calif.

[21] Appl. No.: 08/929,751

[22] Filed: Sep. 15, 1997

[51] Int. Cl.[7] ................................................. H01L 21/336
[52] U.S. Cl. .......................... 438/270; 438/268; 257/330
[58] Field of Search .................................. 438/138, 270, 438/302, 525, 589, 268, 269, 271, 272, 273, 274; 257/330, 331, 332, 333, 334

[56] References Cited

U.S. PATENT DOCUMENTS

| | | | |
|---|---|---|---|
| 5,342,798 | 8/1994 | Huang | 438/286 |
| 5,514,604 | 5/1996 | Brown | 438/270 |
| 5,672,524 | 9/1997 | Liu et al. | 438/270 |
| 5,705,409 | 1/1998 | Witek | 438/212 |
| 5,904,541 | 5/1999 | Rho et al. | 438/433 |
| 5,907,776 | 5/1999 | Hshieh et al. | 438/270 |

OTHER PUBLICATIONS

Stanley Wolf Ph.D. and Richard N. Tauber Ph.D. in Silicon Processing for the VLSI Era, vol. 1: Process Technology, Lattice Press, 1986.

*Primary Examiner*—Tuan H. Nguyen
*Assistant Examiner*—William M. Brewster
*Attorney, Agent, or Firm*—Kam T. Tam

[57] ABSTRACT

A MOSFET (Metal Oxide Semiconductor Field Effect Transistors) structure is fabricated by first forming a plurality of trenches in a semiconductor substrate which includes a major surface. The trenches are then lined with insulating material and thereafter filled with conductive material. The process of filling the conductive material in the trenches normally involves an over-etching step for preventing any residual material remaining on the major surface. The over-etching of the conductive material in the trenches alters the evenness of the major surface and presents a problem for the later angular ion implantation of the source layer. As a consequence, the source layer formed includes asymmetrical source segments which generates nonuniform threshold voltage and punch-through tolerance in the MOSFET structure. The inventive method provides a spacer layer to compensate for the unevenness of the major surface. Prior to the ion implantation of the source layer, the spacer layer is formed above the conductive material and surrounding the insulating material adjacent the major surface. Source segments thus formed are symmetrical in shape enabling the fabricated MOSFET structure to operate with uniform punch-through tolerance, uniform threshold voltage, and uniform current distribution during normal operation.

21 Claims, 10 Drawing Sheets

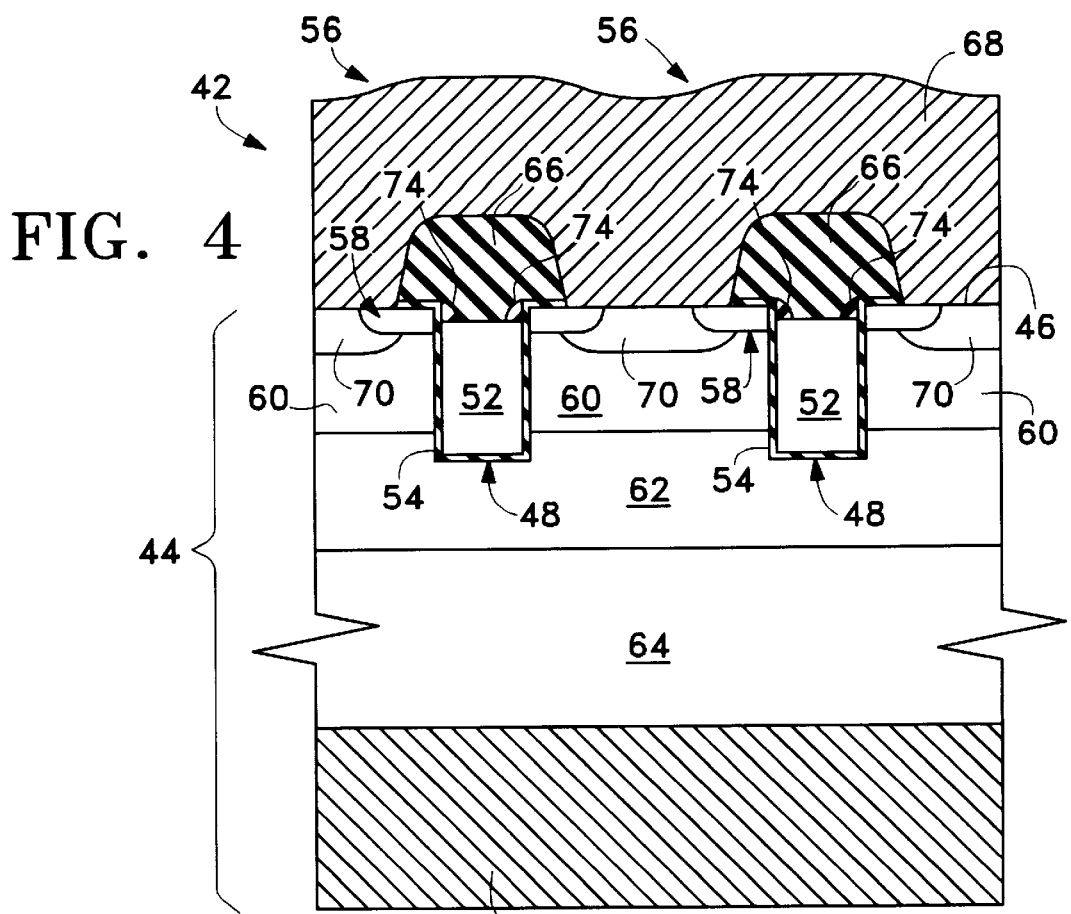
FIG. 4
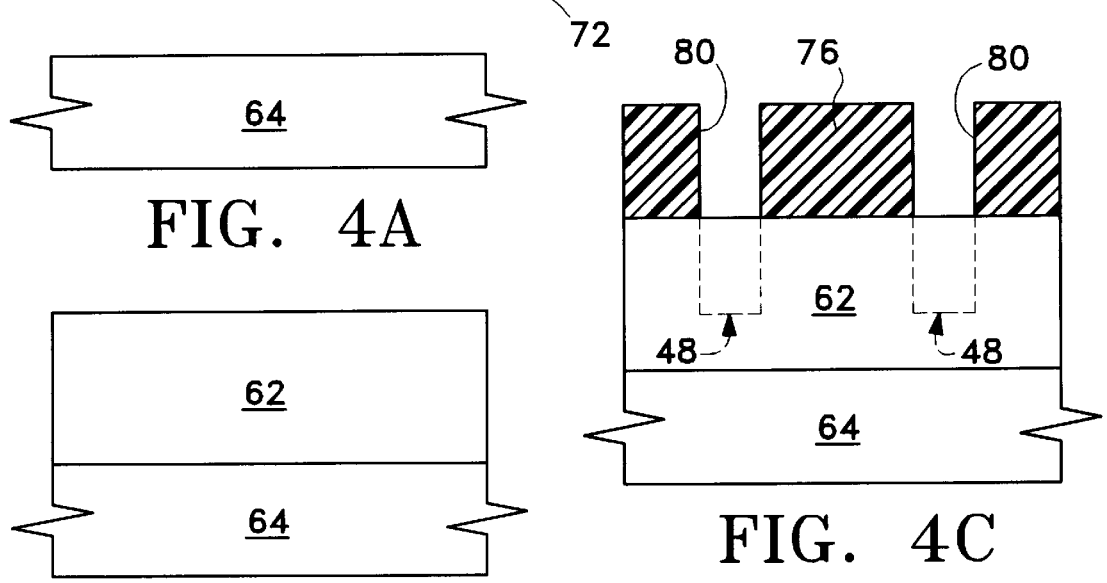
FIG. 4A
FIG. 4B
FIG. 4C

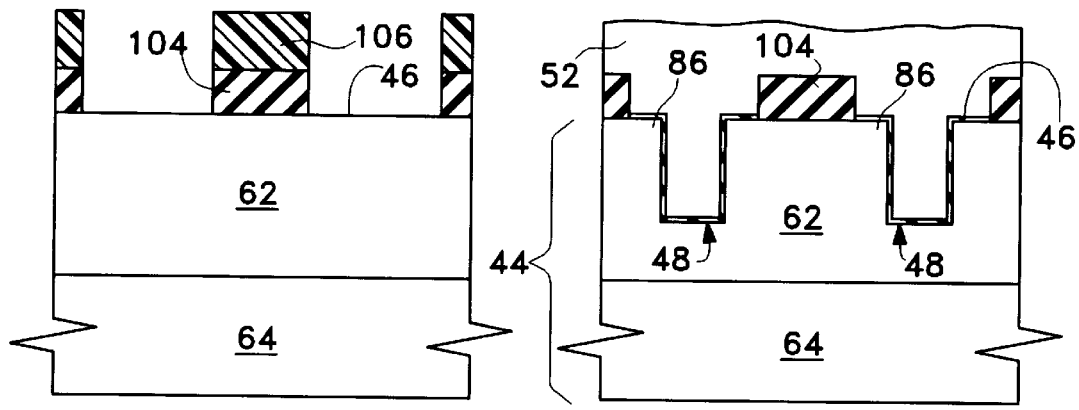
FIG. 5C
FIG. 5F
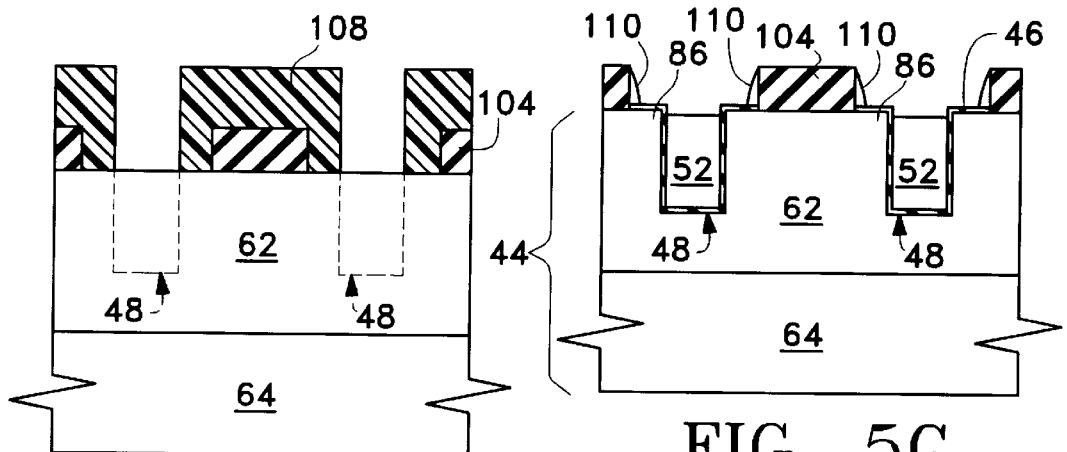
FIG. 5D
FIG. 5G (PRIOR ART)
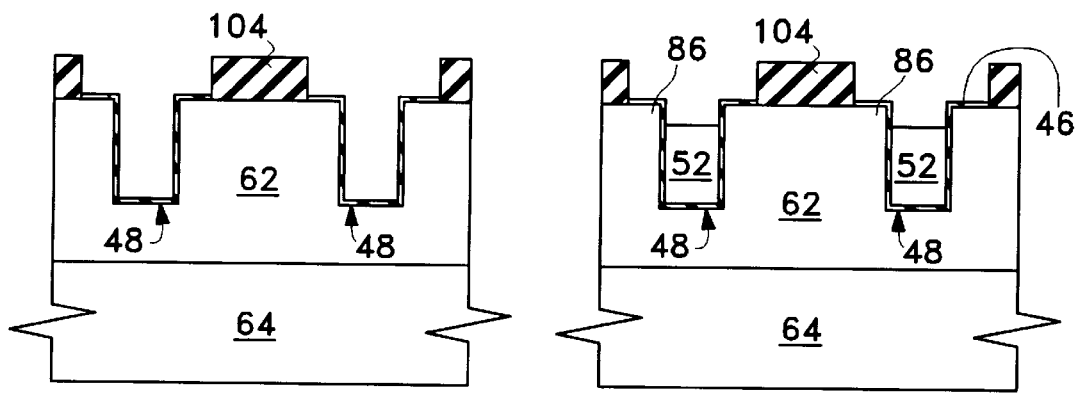
FIG. 5E
FIG. 5H

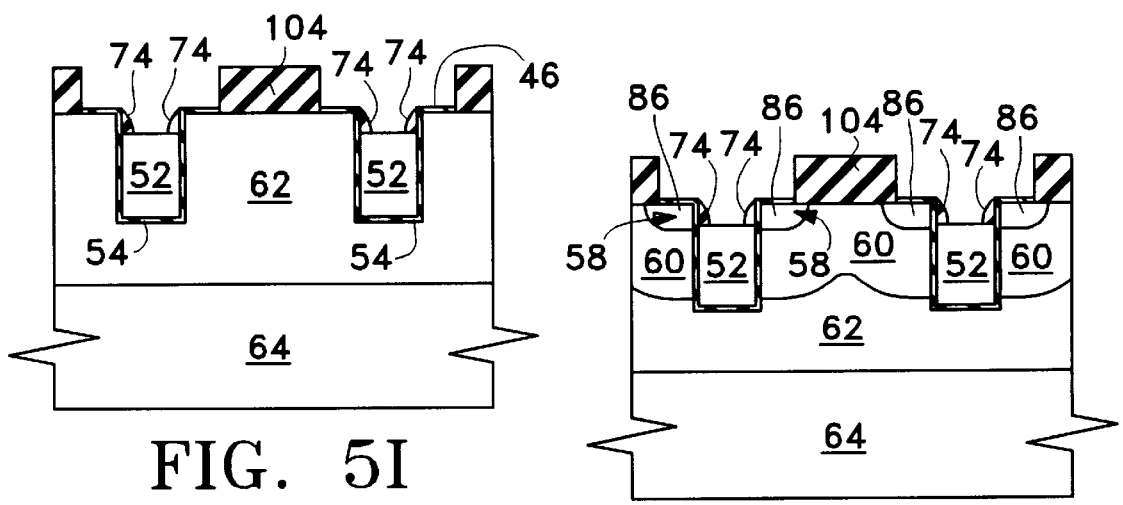
FIG. 5I
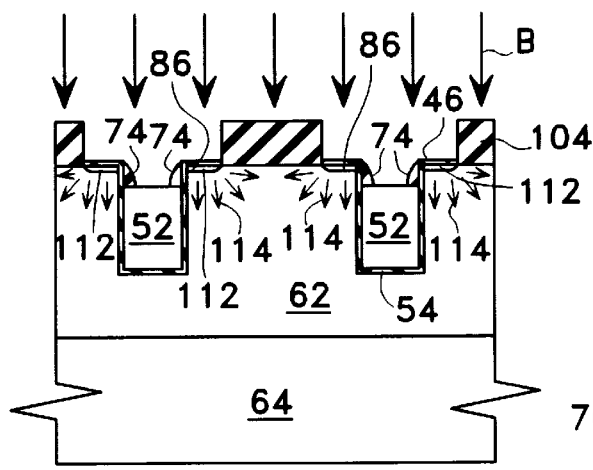
FIG. 5J
FIG. 5K
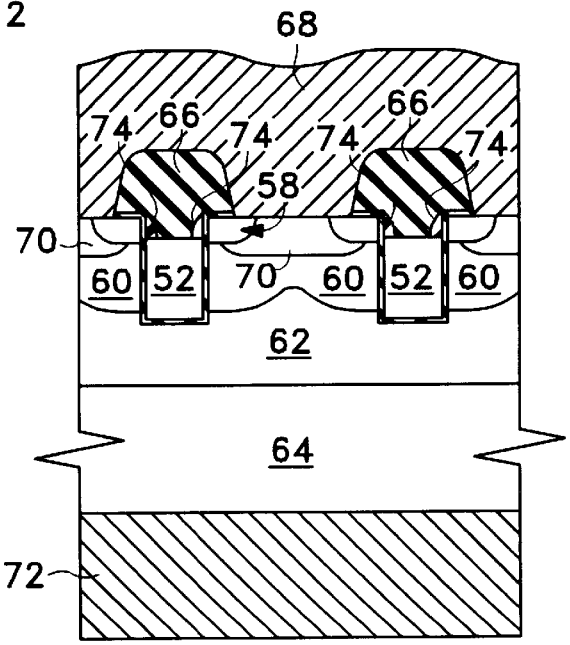
FIG. 5L
FIG. 5M
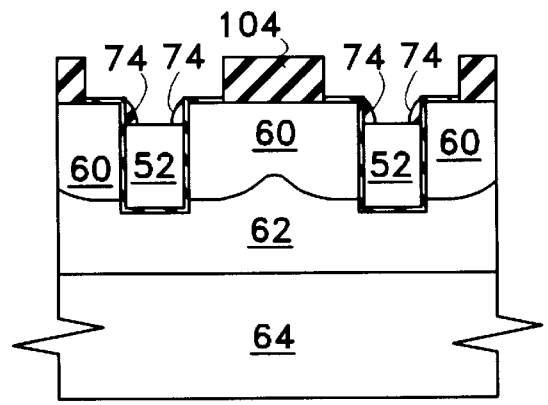

METHOD OF FORMING A SEMICONDUCTOR STRUCTURE WITH UNIFORM THRESHOLD VOLTAGE AND PUNCH-THROUGH TOLERANCE

BACKGROUND OF THE INVENTION

1. Field of the Invention

The present invention relates generally to microelectronic circuits, and more particularly, to power MOSFET (Metal Oxide Semiconductor Field Effect Transistor) structures having uniform punch-through tolerance and threshold voltage along the channel width of each transistor in the structures.

2. Description of the Related Art

Power semiconductor devices have long been used as replacement for mechanical relays in various applications. Development in semiconductor technology enables these power devices to operate with high reliability and performance. However, modern day instruments are now built at a miniaturized scale with low power consumption. These instruments, such as fast switching power supplies, high-frequency ballasts and various portable electronic products, all require power devices to operate under certain stringent requirements. Accordingly, special criteria have to be met in the design and manufacturing of these devices. One area that shows prominence is the fabrication of power metal oxide semiconductor field effect transistor (MOSFET) using trenched gates.

In a trenched gate MOSFET structures, intersecting trenches which define a plurality of cells are formed in a silicon substrate. The trenches are filled with conductive material separated from the silicon substrate with a thin layer of insulating material. There are also other diffusion layers, such as the channel and source layers, of different impurity types and concentration deposited in the semiconductor substrate. As arranged, the conductive and insulating materials in the trenches constitute the gate and gate oxide layer, respectively, of the MOSFET. In addition, the perimeter and the depth of the cell correspond to the respective channel width and depth of each MOSFET cell.

Power MOSFET with trenched gates provide many advantages. To begin with, the channels of the MOSFETs are arranged in a vertical manner, instead of horizontally as in most planar configurations. The consequential benefit is that a higher degree of integration on a semiconductor substrate can be realized. More importantly, since the channel direction is vertical, the lateral current paths, normally congestively packed, are basically eliminated. As a result, the overall channel resistance is reduced. Reduction in channel resistance substantially curtails the ohmic loss during the power-on state of the MOSFET, which in turn provides lower power consumption and further alleviates heat dissipation.

Advantageous as it appears, there are technical difficulties associated with the fabrication of such trenched MOSFET devices. One of such difficulties confronted by manufacturers is the problem of uneven punch-through tolerance along the channel width of a trenched gate MOSFET. To understand the underlying causes of the uneven punch-through problem associated with a MOSFET, the structure and operation of a conventional MOSFET cell need first be explained.

FIG. 1 shows two conventional trenched gate MOSFET cells 2 placed adjacent to each other in an cell array 4. The cells 2 share a common substrate 6. Formed in the substrate 6 are trenches 8 filled with conductive material 10 which is electrically separated from the substrate 6 by an insulating layer 12. The substrate 6 includes a base drain layer 20 epitaxially grown with an epitaxial layer 14. Deposited atop the expitaxial layer 14 is a body layer 16. There is also a source layer 18 diffused in the body layer 16. As arranged, the epitaxial layer 24 in conjunction with the heavily doped base drain layer 20 which is in contact with a drain metal layer 22 constitute the drain D of the MOSFET array 4. The source layer 18 in contact with the source metal layer 24 forms the source S of the array 4. The conductive material 10 inside the trenches 8 are connected together (not shown in FIG. 1) becomes the gate G of the array 4. As shown in FIG. 1, the source layer 18 does not have symmetrical source regions 18R and 18L along the line of symmetry 26 for each cell 2.

The reason for the asymmetrical disposition of the source regions 18R and 18L in the body region 16 stems from the conventional manufacturing process having no means of correction or compensation. During fabrication in a conventional process, after the trenches 8 are formed in the substrate 6 with the lined insulating material 12, the trenches 8 are filled with conductive material 10. To accomplish this end, the entire substrate 6 is covered with conductive material 10. Thereafter, the unwanted conductive material 10 is etched away such that the remaining conductive material 10 is barely within the trenches 8. The goal is to leave no residues left on the top surface 28 of the substrate 6. This step is crucial in the fabrication process because any residual conductive material 10 remaining on the substrate surface may cause electrical shorts for the subsequent overlying layers. As a safeguard, the conductive material 10 are normally somewhat over etched below the substrate surface 28. As shown in FIG. 2, the conductive material 10 is etched below the substrate surface 28 at a depth x as a margin of safety. To determine the value of the depth x, it needs to take into consideration of the different etch rates within a wafer (not shown) in which the multiplicity of cell arrays 4 are diced from. Very often, the areas closer to the center of the wafer assumes a higher etch rate than the areas near the edge of the wafer. The larger the area of the wafer, the more deviated is the value of the depth x. To maintain high production yield, the value of the depth x is normally set at a higher value. However, etching the depth x to a higher value consequently results in the asymmetrical disposition of the source layer 18 as is herein described.

The source layer 18 is formed by first ion-implanting the substrate 6 with a preselected source material and thereafter diffusing the implanted source material into the substrate 6. During ion-implantation of the source layer 18, the ion beam 30 needs to be skewed at an angle α with respect to the normal 32 to the substrate surface 28 as shown in FIG. 2. The chief reason for the skew orientation of the ion beam 30 is to avoid the channeling effect, which is briefly described here in conjunction with FIG. 3. A detailed analysis of the channeling effect can be found in Wolf et al., "Silicon Processing for the VLSI Era", Vol 1., Lattice Press, 1986, pages 292–294.

As is known in the art, to facilitate anisotropic etching of the trenches 8, the crystal orientation of the wafer is normally chosen to be orthogonal with respect to the substrate surface 28. If the skew angle α is zero, the ion beam 30 may theoretically encounter no crystal lattice reflection and travels unopposed through the wafer 34 as shown in FIG. 3. To predictably control the depth of the ion implant in the substrate 6, the ion beam 30 is commonly aimed at the angle α with respect to the wafer normal 32 during implantation. However, problems arise if the value of the depth x (FIG. 2) is too large.

As shown in FIG. 2, with the conductive material 10 etched below the substrate surface 28 at a depth x, substrate steps 86 with step height x are formed at the entry of the trenches 8. Prior to ion-implantation of the source layer 18, the substrate 6 is patterned with a photoresist mask 36 which eventually defines the various source segments 18R and 18L. With the ion beam 30 aiming at the wafer surface 28 at an angle α, the exposed top portions T1 and T2 of the substrate steps 86 are implanted with source material at the right and left sides of the trench 8, respectively. In addition, the exposed sidewall portion W1 of the step 86 at the right side of the trench 8 having a depth x is also impregnated with source material. Subsequently, the implanted source material at regions T1, T2 and W1 simultaneously undergo a diffusion process in which the asymmetrical source regions 18R and 18L will result.

The presence of the asymmetrical source regions 18R and 18L around the trench gate 8 is undesirable in several aspects. First, the asymmetrical arrangement of the source segments 18L and 18R in the source layer 18 will cause asymmetrical current flow during normal operation. As shown in FIG. 2, because the source region 18R encroaches closer to the epitaxial layer 14 which is part of the drain D, the right side of the trench gate 8 has a channel length $L_R$ which is shorter than the left side of the channel length $L_L$. Current always seeks the path with the lowest resistance to pass through. As a consequence, the right side of the MOSFET cell 2 is more crowded in current than the left side counterpart resulting in an uneven heat dissipation pattern on the array 4 as a whole. Furthermore, the asymmetrical source layer 18 also yields nonuniform threshold voltages along the channel width of each transistor 2, resulting in the threshold voltage of the entire MOSFET array 4 assuming a wide margin and is difficult to specify. However, most detrimental of all is the premature punch-through problem caused by the expanded source region 18R toward the epitaxial layer 14.

Returning to FIG. 2, during normal operation, the epitaxial layer 14 and the body layer 16 are reversely biased. As such, a depletion region 38 is formed at the common boundary of the layers 14 and 16 with an overall depletion width W. Since the body layer 16 has a higher impurity concentration than the epitaxial layer 14, the portion of the depletion region 38 is wider at the epitaxial layer 14 than the corresponding portion at the body layer 16. At still higher reverse bias potential, a point may be reached whereby the depletion region 38 merges with the source region 18R. The MOSFET cell 2 is said to be at the state of punch-through. During punch-through, current traverses directly through the source layer 18 and the drain D via the epitaxial layer 14 with no control whatsoever by gate G (FIG. 1). A MOSFET incapable of being controlled by the gate G is a malfunctioning MOSFET.

Attempts have been made to tackle the premature punch-through problem in a trenched MOSFET. Disclosed in U.S. Pat. No. 5,468,982, Hshieh et al., entitled "Trenched DMOS Transistor with Channel Block at Cell Trench Corners", issued Nov. 21, 1995, is a trenched gate MOSFET with the MOSFET cell corner regions completely blocked off. In the '982 patent, cell corners of the source implant mask are covered during the deposition of the source layer, thereby avoiding the formation of the MOSFET at the corner regions. However, with this approach, the channel width, which is defined as the cell perimeter length as mentioned above, is also consequently shortened. A shortened channel width increases the overall channel resistance $R_{ON}$.

Instruments are now built with ever increasing complexity and decreasing physical sizes. To satisfy the stringent requirements demanded of these instruments, reliable power devices with high performance need to be provided. Specifically, the power devices need to exhibit ruggedness in performance with predictable operating ranges. At the same time, production yield and manufacturing costs also need to be controlled. There has been a long-felt and increasing need to provide power devices meeting the aforementioned criteria.

SUMMARY OF THE INVENTION

It is accordingly the object of the invention to provide a power semiconductor device with uniform and predictable punch-through tolerance and threshold voltage throughout the device.

It is another object of the invention to provide a power semiconductor device which uniform current distribution during normal operation, thereby preventing uneven heat dissipation throughout the device.

It is yet another object of the invention to provide the aforementioned features in the MOSFET device with no special tooling, thereby curtailing manufacturing costs.

The MOSFET device of the invention accomplishes the above objectives with a novel approach by first forming a plurality of trenches in a semiconductor substrate which includes a major surface. The trenches are then lined with insulating material and thereafter filled with conductive material. The process of filling the conductive material in the trenches normally involves an over-etching step for preventing any residual material from remaining on the major surface. The over-etching of the conductive material in the trenches normally alters the topographical evenness of the major surface and subsequently presents a problem for the later angular ion implantation of the source layer. As a consequence, the source layer formed includes asymmetrical source segments which generates nonuniform punch-through tolerance and threshold voltage in the MOSFET device. The inventive method provides a spacer layer to compensate for the unevenness of the major surface. Prior to the ion implantation of the source layer, the spacer layer is deposited above the conductive material and surrounding the insulating material adjacent the major surface. Source segments thus formed are symmetrical in shape allowing the fabricated MOSFET device to operate with uniform punch-through tolerance and uniform current distribution during normal operation.

These and other features and advantages of the invention will be apparent to those skilled in the art from the following detailed description, taken together with the accompanying drawings, in which like reference numerals refer to like parts.

DESCRIPTION OF THE DRAWINGS

FIG. 1, as described above, is a cross-sectional view of a conventional MOSFET structure with asymmetrical source segments in the source layer;

FIG. 2, as described above, illustrates the causation of the asymmetrical source formation of the MOSFET structure as shown in FIG. 1;

FIG. 3 is a schematic view showing the consequence of the channeling effect during ion implantation;

FIGS. 5A–5M are sequential views illustrating the process of making the MOSFET structure as shown in FIG. 5.

DETAILED DESCRIPTION OF THE INVENTION

Figure 4D:
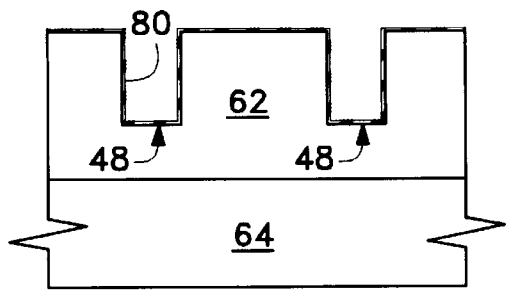
FIG. 4 is a first embodiment of the invention.
FIGS. 4A–4T are sequential views illustrating the process of making the MOSFET structure as shown in FIG. 4.

Reference is now made to FIG. 4 which shows the cross-sectional view of the first embodiment of the invention. The semiconductor structure of the invention is generally signified by the reference numeral 42 which includes a substrate 44 having a major surface 46. Formed in the substrate 44 is a plurality of trenches 48 filled with conductive material 52 which is electrically separated from the substrate 44 by thin insulating layers 54. In this embodiment, the materials for the substrate 44, conductive material 52 and the insulating layers 54 are respectively crystalline silicon (Si), polycrystalline silicon (Si), and silicon dioxide ($SiO_2$). Each MOSFET cell 56 in this embodiment is a N-channel device which comprises a source layer 58 made of N-type material, a body layer 60 formed of lightly doped P-type material, an epitaxial layer 62 made of N-type material, and a base drain layer 64 based on a heavily doped N-type material. Atop the trenches 48 is a dielectric layer 66 insulating the conductive material 52 from a source contact metal layer 68. The source contact metal layer 68 is disposed in contact with the substrate 44 via contact regions 70 which is heavily doped with P-type material. There is also a drain metal contact layer 72 attached to the base drain layer 64 of the MOSFET structure 42. The conductive material 52 in the each trenched gate 48 is electrically connected but is not shown in FIG. 4. Above the conductive material 52 in each trench 48 is a spacer layer 74 which surrounds the insulating layer 54 adjacent the major surface 46. The spacer layer 74 serves very important functions during the fabrication process and will be explained later.

Figure 4E:
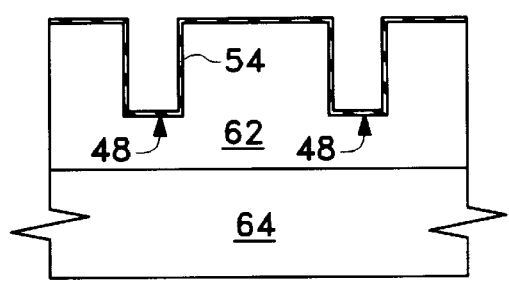
Figure 4F:
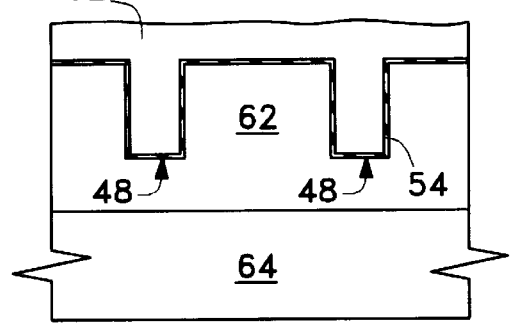
Figure 4G:
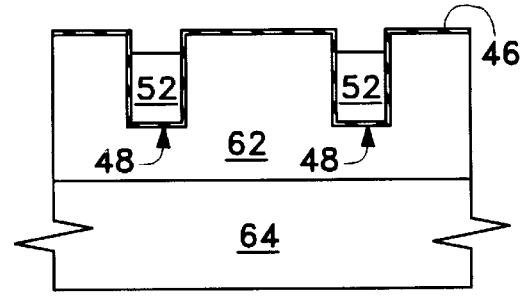
Figure 4H:
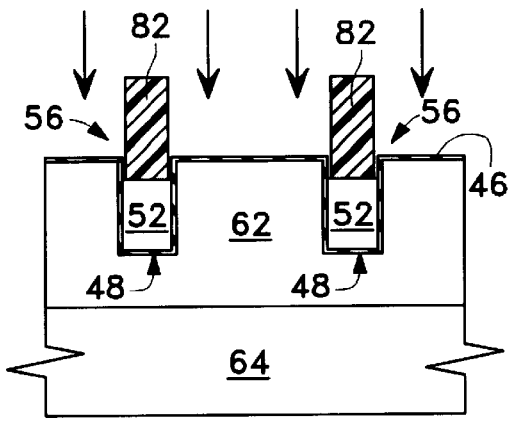
Figure 4I:
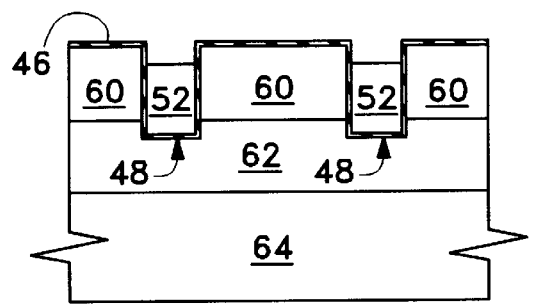
Figure 4J:
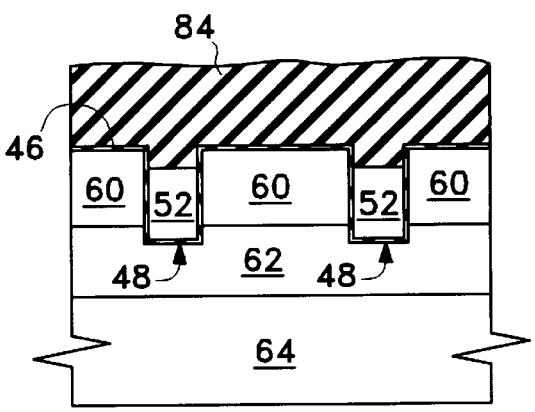
Figure 4K:
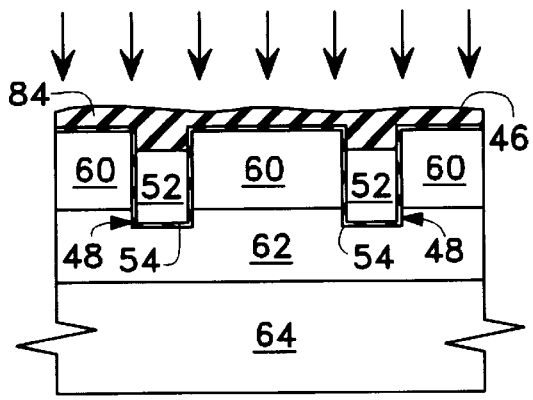
Figure 4N:
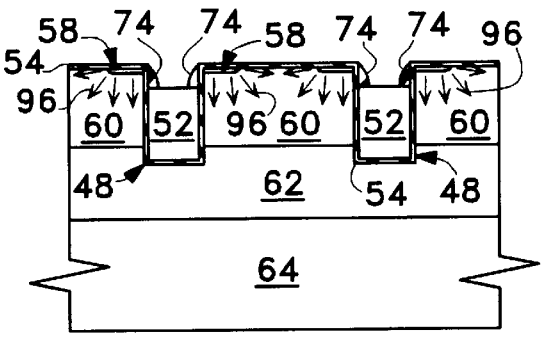
Figure 4L:
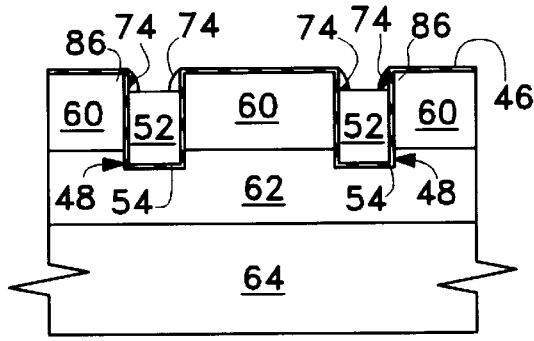
Figure 4O:
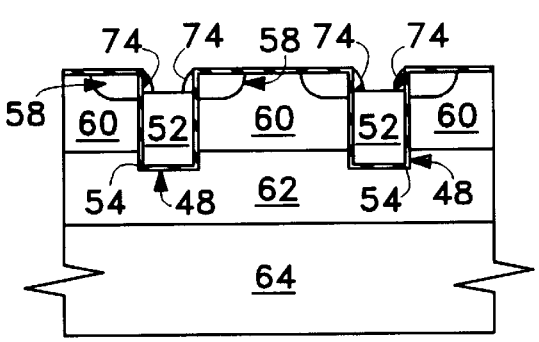
Figure 4M:
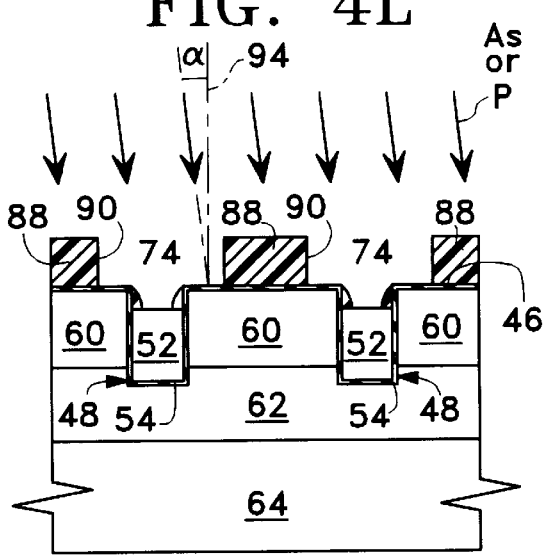
Figure 4P:
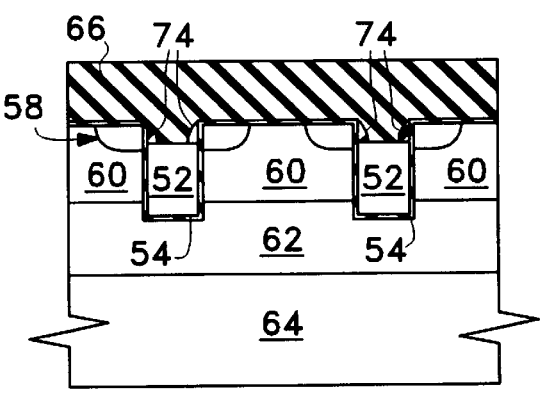
Figure 4S:
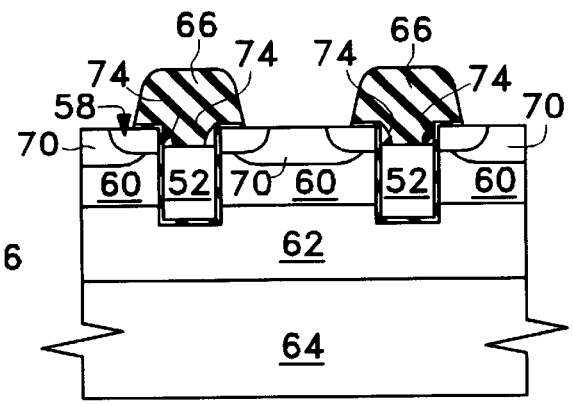
Figure 4Q:
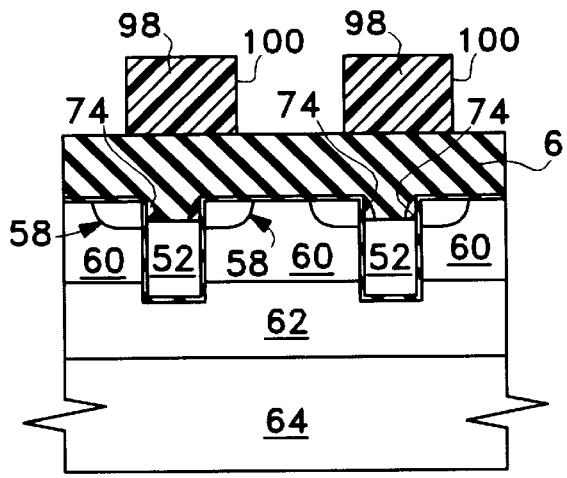
Figure 4R:
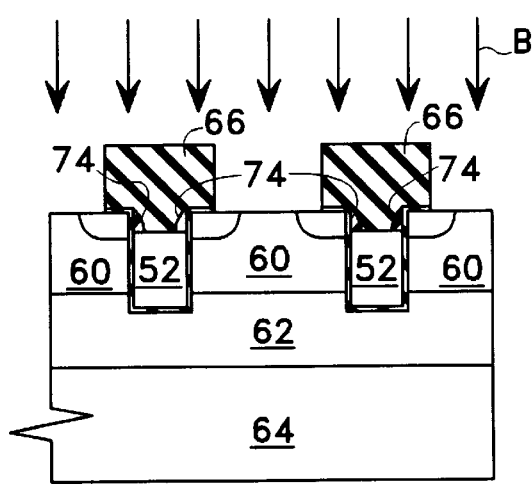
Figure 4T:
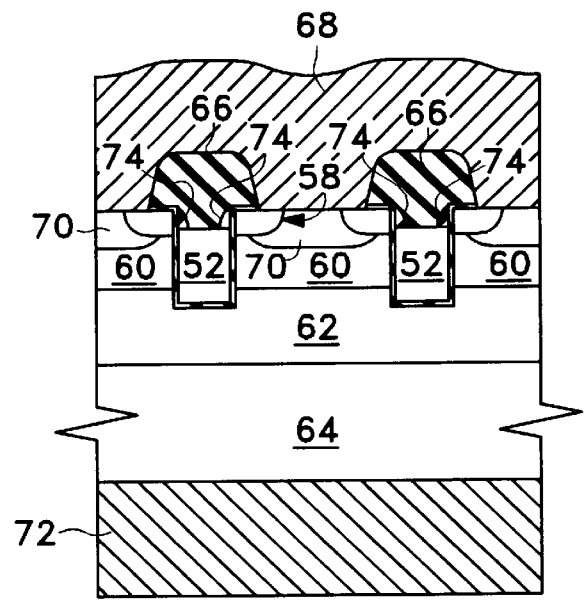

FIGS. 4A–4T are sequential views showing the process of making the MOSFET structure 42 of the invention. FIGS. 4A–4T are shown with the various layer thickness not in scale for the purpose of illustration. The fabrication process starts with providing a N-type base silicon wafer 64 with a <0,0,1> crystal orientation and a resistivity of between 0.001 Ω-cm–0.007 Ω-cm, for example, as shown in FIG. 4A. An epitaxial layer 62 with a resistivity of approximately between 0.1 Ω-cm–2.0 Ω-cm is then grown atop the base wafer 64 to a thickness of approximately 3 μm to 20 μm. The resultant structure up to this step is shown in FIG. 4B.

A photoresist layer 76 is then spunned atop the epitaxial layer 62. Conventional techniques of masking and etching are employed to selectively open windows 80 in the photoresist layer 76. Using the photoresist layer 76 as a shielding mask, the structure is then subjected to the standard technique of dry anisotropic etching by exposing the structure to a plasma (not shown) for the formation of the trenches 48 as shown in FIG. 4C.

What follows is the step of forming gate oxide layers by lining the trenches 48 with insulating material. First, the trenches 48 has to undergo a sacrificial oxidation process. Basically, the structure is exposed to oxidation agent of either oxygen ($O_2$), if the dry method is employed, or steam ($H_2O$), if the wet method is preferred, under an ambient temperature of approximately between 900° C.–1,100° C. The finished structure up to this step is shown in FIG. 4D. The grown sacrificial oxide layer 80 is then lightly etched away for the purpose of securing a smooth silicon surface as a prelude for subsequent gate oxide growth. The method of wet etch can be applied for the removal of the sacrificial oxide layer 80.

The step of gate oxide growth is then carried out by exposing the structure to either dry or wet agents as described above, under an ambient temperature of between 800° C.–1,100° C. to a thickness of approximately 200 Å–1,000 Å. The finished structure with a grown gate oxide layer 54 is as shown in FIG. 4E.

The trenches 48 need to be filled with conductive material. In this method, the trenches 48 are filled with polycrystalline silicon 52 by the conventional method of chemical vapor deposition (CVD). The step of either mechanical or chemical planarization then follows. The remaining polycrystalline silicon 52 is then doped with phosphorus oxychloride ($POCl_3$) to a sheet resistivity of approximately 20–40 Ω/□ under an ambient temperature of about 950° C. The remaining polycrystalline silicon 52 is further chemically etched until the surface is below the major surface 46. It should be noted that this step is crucial in the fabrication process. If the polycrystalline silicon 52 is under-etched, remnant material which is electrically conductive staying on the major surface 46 may cause electrical shorts for the subsequent overlying layers. As a safeguard, the conductive material 52 are normally over-etched for the purpose securing a clean major surface 46. The resultant structure up to this step is shown in FIG. 4G.

Another photoresist mask 82 is patterned above the structure, which is then ion-implanted with boron (B) under an implant potential of approximately 30 KeV–100 KeV at a dosage of about $2 \times 10^{13}$ cm$^{-2}$ to $2 \times 10^{14}$ cm$^{-2}$. It should be noted that the photoresist mask 82 is used mainly for the fabrication of the termination circuit region (not shown) and its use for the processing of the MOSFET cells 56 is optional. Without the mask 82, boron ions can well be implanted into the polycrystalline silicon 52 as it has already been doped heavily with the N-type dopant ($POCl_3$) as described above. The N-type dopant heavily doped previously overshadows the relatively lightly doped boron in the polycrystalline silicon 52. The photoresist mask 82, if used as shown in FIG. 4H, is then stripped away from the structure which then undergoes a drive-in cycle at a temperature of about 1,100° C.–1,150° C., resulting in a lightly doped P-type body layer 60 driven in the epitaxial layer 64 as shown in FIG. 4I.

The entire structure is covered with insulating material 84 to a thickness of approximately 2,000 Å–7,000 Å, as shown in FIG. 4J. In this method, the insulating material 84 used is silicon dioxide ($SiO_2$) and the method employed is CVD. Alternatively, other insulating materials such as Alumina ($Al_2O_3$) can be used. The method of sputtering in lieu of CVD can also be used for the deposition of the insulating material 84.

The technique of reactive ion etching (RIE) is employed for the selective etching of the insulating layer 84. The etchant used is energized plasma which attacks the insulting layer 84, made of silicon dioxide in this case, at a controlled rate as shown in FIG. 4K. After the RIE step, portions of the insulating layer 84 cling to the boundaries at the entries to the trenches 48, resulting in a spacer layer 74 formed above the conductive material 52 and surrounding the insulating material layer 54 as shown in FIG. 4L. This is due to the "shadowing" effect of the RIE etchant by the steps 86, which are formed by the over-etching of the conductive material 52 in the trenches 48 as explained previously. In essence, the substrate steps 86 shield the etching plasma from over retching the insulting material 84 under the step shadows.

Thereafter the deposition of the source layer 58 follows. First, a photoresist mask 88 with source layer windows 90 is formed on the top of the structure. Either arsenic (As) or phosphorous (P) can be ion-implanted into the masked structure with an implant dosage of approximately $5 \times 10^{15}$ cm$^{-2}$ to $1 \times 10^{16}$ cm$^{-2}$ under an implant potential of between 40 KeV to 100 KeV, as shown in FIG. 4M. As noted previously, to avoid the "channeling effect" of the implanting ions passing through the structure unobstructively, the implanting ion bean 92 should be orientated at an angle α with respect to the normal 94 to the major surface 46. In this method, the angle α is approximately 7 degrees.

After the ion-implanting step, the masking layer 88 is removed. The implanted source material 58 stays adjacent the major planar surface 46 under the insulating layer 54 as shown in FIG. 4N. The structure then undergoes a diffusion cycle at a temperature range of approximately 900° C.–1,000° C. The implanted ions 58 in each source region diffuse radially in the body layer 60 in a downwardly and sidewardly direction 96 as shown in FIG. 4N. The diffusion cycle can be timed to a duration of between 10 minutes to 50 minutes, resulting in a junction depth of approximately 1$\mu$ to 2$\mu$ for the source layer 58 as shown in FIG. 4O.

Thereafter, the deposition step of the dielectric layer 66 follows via the CVD method, for example, as shown in FIG. 4P. The material for the dielectric layer 66 can be phosphosilicate glass (PSG) or borophosphosilicate (BPSG). Afterwards, another photoresist layer 98 patterned with contact windows 100 is disposed atop the dielectric layer 66 as shown in FIG. 4Q.

The dielectric layer 66 is then etched through the patterned mask 98 using an etchant which significantly attacks the dielectric layer 66 but not the patterned photoresist mask 98. Either the method of dry etch or wet etch can be employed. If the dry etch method is used, the etchant is plasma. If the wet etch method is adopted, the etchant can be hydrofluoric (HF) acid. Thereafter, the mask 98 is removed, the resultant structure up to this step is shown in FIG. 4R.

Using the patterned dielectric layer 66 as a mask, boron (B) ions are then implanted into the structure as shown in FIG. 4R. The implanted boron is thereafter driven into the P-type body layer 60 to a predetermined depth. The drive-in step of the implanted boron can be carried out concurrently with the densification step for the dielectric layer 66 under a temperature range of about 900° C.–950° C. for 30 minutes to 60 minutes. As a consequence, contact regions 70 are formed in the body layer 60 and the corners of the dielectric layer 66 are also rounded off as shown in FIG. 4S.

The source and drain metal contact layers 68 and 72 can thereafter be deposited with conventional microelectronic processing techniques and are not further elaborated in here. The eventual structure up to this step is shown in FIG. 4T.

Figure 5:
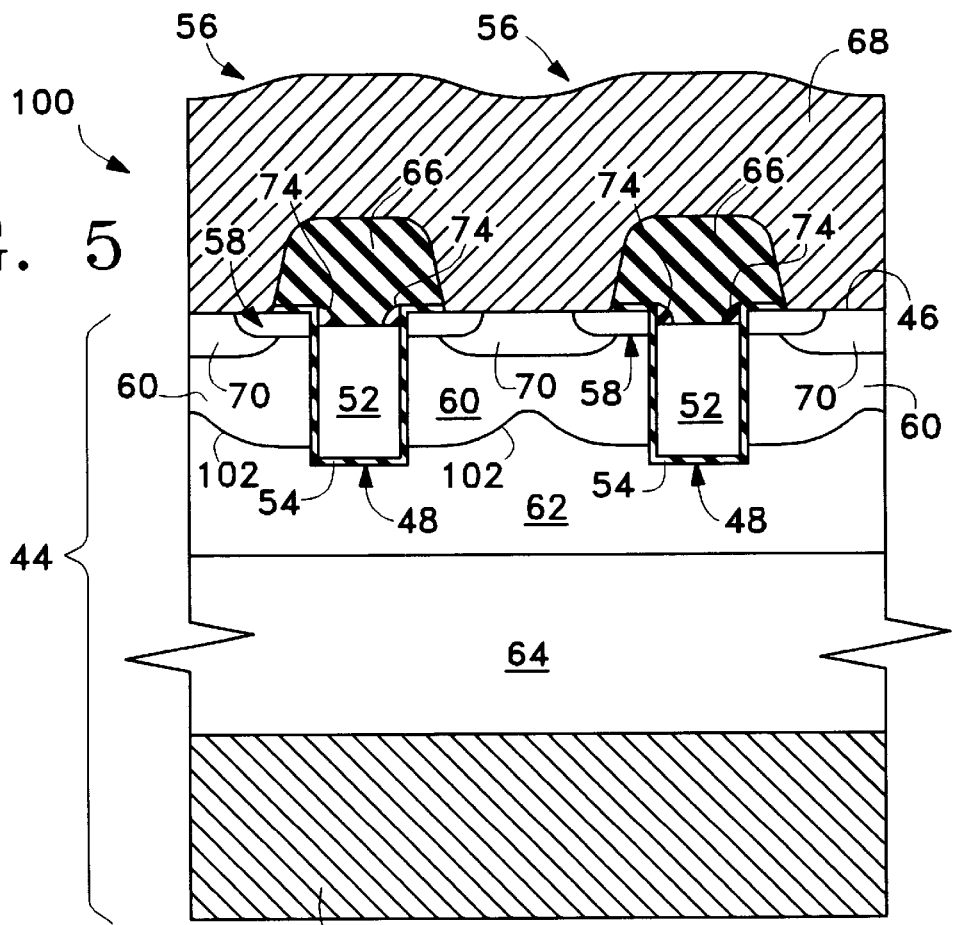
FIG. 5 is a second embodiment of the invention.

FIG. 5 shows the cross-sectional view of the second embodiment of the invention. The semiconductor structure of this embodiment is generally signified by the reference numeral 100 which includes a substrate 44 having a major surface 46. As with the previous embodiment, formed in the substrate 44 is a plurality of trenches 48 filled with conductive material 52 which is electrically separated from the substrate 44 by thin insulating layers 54. Each cell MOSFET cell 56 is a N-channel device which comprises a source layer 58 made of N-type material, a body layer 60 formed of lightly doped P-type material, an epitaxial layer 62 made of N-type material, and a drain layer 64 based on a heavily doped N-type material. Atop the trenches 48 is a dielectric layer 66 insulating the conductive material 52 from a source contact metal layer 68. The source contact metal layer 68 is disposed in contact with the substrate 44 via contact regions 70. There is also a drain metal contact layer 72 attached to the drain 64 of the MOSFET structure 42. The difference between this embodiment and the previous embodiment is the nonuniform boundary 102 between the body layer 60 and the epitaxial layer 62. The nonuniform boundary 102 is the result of a fabrication process described below for the purpose of saving a masking layer and its associated steps.

Figure 5A:
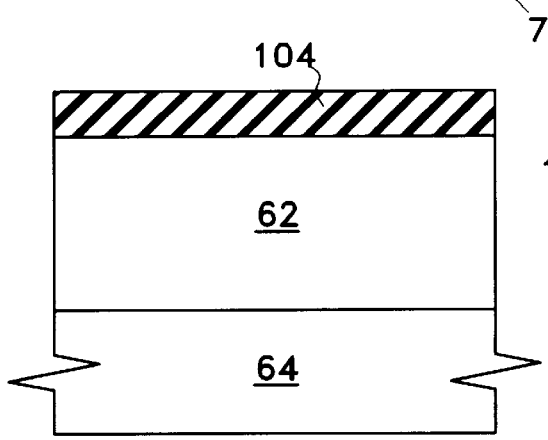
Figure 5B:
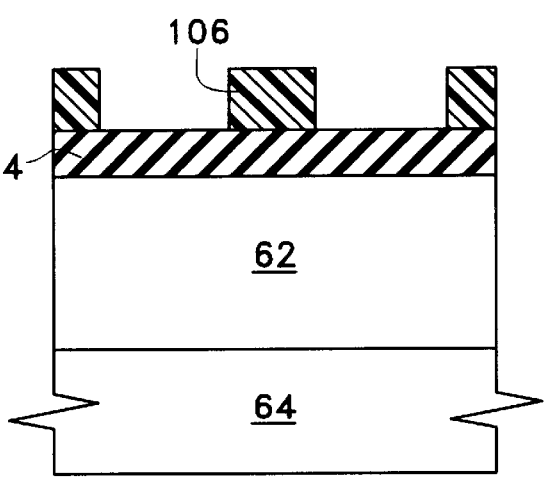

FIGS. 5A–5M are sequential views showing the process of making the second MOSFET structure 100 of the invention. Again, FIGS. 5A–5M are shown with the various layer thickness not in scale for the purpose of illustration. The fabrication process starts with providing a N-type base silicon wafer 64 with a <0,0,1> crystal orientation. An epitaxial layer 62 is grown atop the base wafer 64 in the same manner as described in the first method. Thereafter, an oxide layer 104 is grown atop the epitaxial layer 62 by the CVD method, for example. The resultant structure up to this step is as shown in FIG. 5A.

Employing the conventional photolithography technique, a photoresist mask 106 is patterned atop the oxide layer 104 as shown in FIG. 5. Relying on the patterned mask 106 as a shielding template, the oxide layer 104 is etched via the method of either dry or wet etch. The resultant structure up to this step is shown in FIG. 5C. The etched oxide layer 104 with the transferred image formed the patterned mask 106 will serve the dual purpose for the subsequent delineation of the source layer 58 and for the definition of body layer 60, as will be explained later.

The photoresist layer 106 is removed by a photoresist solvent. Another photoresist layer 108 is then patterned onto the structure. The purpose of the photoresist layer 108 is for the definition of the trenches 48. The resultant structure up to this step is as shown in FIG. 5D.

In a similar fashion as with the previous method, the structure undergoes a dry anisotropic etching by exposing the masked structure to a plasma (not shown) for the formation of the trenches 48. Thereafter, the trenches 48 are lined with insulating material 54 as shown in FIG. 5E in a similar manner as the first method. The resultant structure up to this step is shown in FIG. 5E.

The trenches 48 are then filled with conductive material 52, which is polycrystalline silicon as shown in FIG. 5F. Again, either mechanical or chemical method can be used to remove the unwanted conductive material 52.

Figures 1, 2, 3:
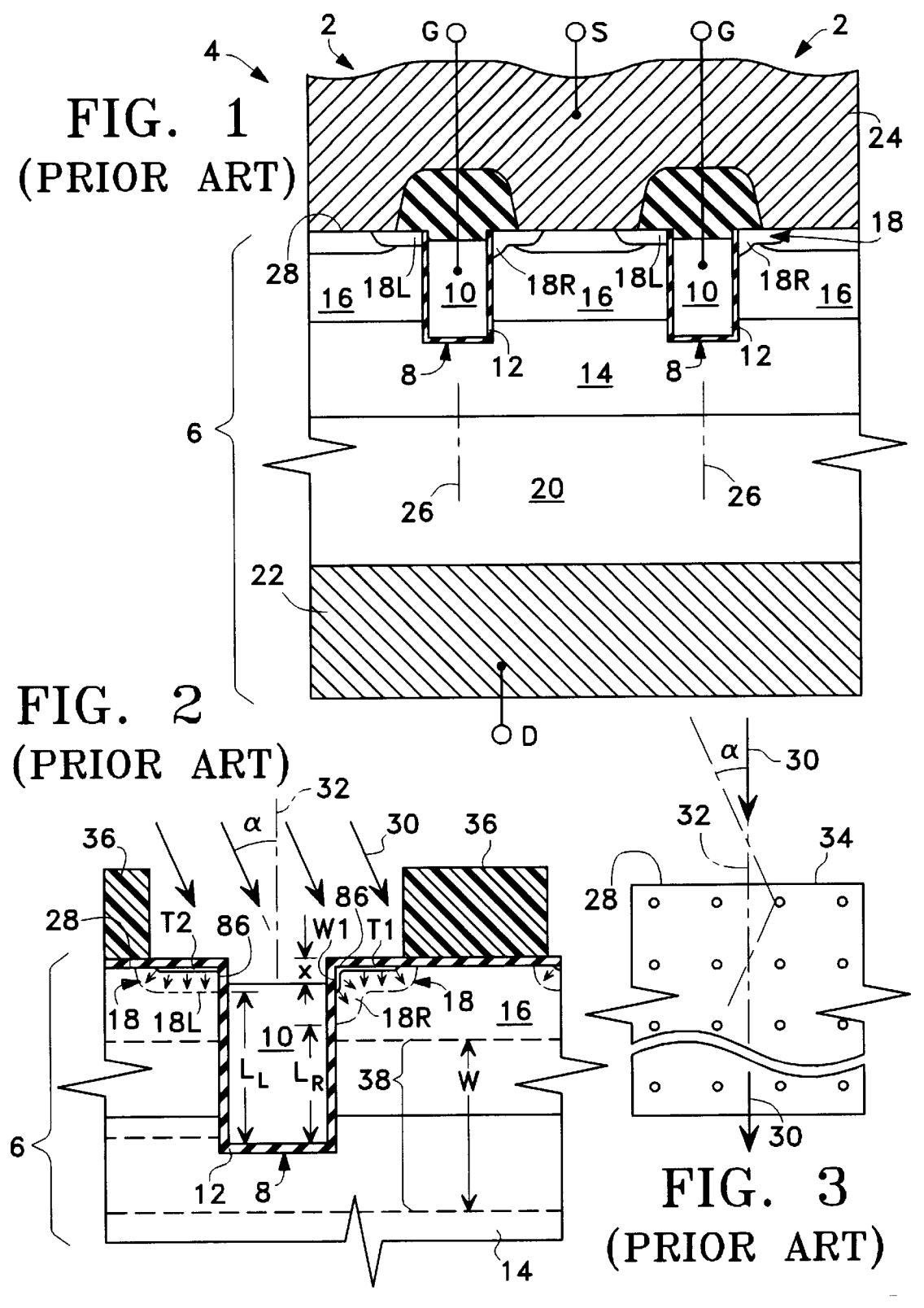

At this juncture, it should be noted that under conventional practice, the conductive material 52 would normally not be over-etched for the purpose of avoiding deep substrate steps 86 at the entrances of the trenches 48 which can result in the sidewall impregnation of source material of the steps 86 in the subsequent ion-implantation and consequently results in asymmetrical source regions as shown in FIGS. 1 and 2 and as previously described. However, the drawback with the conventional practice is twofold. First, remnant conductive material 52 may remain on the major surface 46 and may thereafter causes electrical shorts between the conductive material 52 and any subsequent deposited overlying layers. Furthermore, the "shadowing" effect of the masked oxide layer 104 during the etching process retains residual conductive material 52 along the peripheries of the mask segments of the mask 104. As a consequence, portions of the conductive material 52 designated by the reference numeral 110 cling onto the sidewalls of the layer segment of the oxide layer 104 as shown in FIG. 5G. The oxide layer 104 will eventually be removed. The exposed major surface 46 of the substrate 44 after the removal of the oxide layer 104 will become the source contact for the MOSFET structure. The residual portions 110 will be a nuisance and are difficult to be dealt with during the removal of the oxide layer 104. The portions 110 prevent the later formation of a reliable source contact prior to the deposition of the source metal layer 72.

The inventive method is especially advantageous to solve the aforementioned problems. That is, in accordance with the invention, the conductive material 52 is intentionally over etched, resulting in relatively deep steps 86 formed between the conductive material 52 and the planar surface 46 as shown in FIG. 5H. The over etching of the conductive material 52 also eliminates the residual portions 110 of the conductive material 52 clinging to the peripheries of the oxide layer 104 described above and as shown in FIG. 5G.

In a similar manner as described in the previous method, a spacer layer 74 is formed above the conductive material 52 and surrounding the insulating material layer 54 as shown in FIG. 5I.

The deposition of the body layer follows. Relying on the patterned oxide layer 104 again as a shield, P-type material, such as boron (B), is ion-implanted into the planar surface 46 through the thin insulating layer 54 under an implant potential of between 30 KeV to 100 KeV at a dosage of approximately $3 \times 10^{13}$ cm$^{-2}$ to $3 \times 10^{14}$ cm$^{-2}$, as shown in FIG. 5J. The implanted boron 112 stays at the planar surface 46. The structure then undergoes a diffusion cycle at a temperature range of approximately 1,000° C.–1,200° C., for a time duration of between 10 minutes to 2 hours to a junction depth of approximately $2\mu$ to $10\mu$. Each region of implanted boron diffuses radially in the epitaxial layer 62 in a downward and sideward direction 114 as shown in FIG. 5J. After the diffusion step, selected portions of the diffused boron merge together to form a body layer 60 as shown in FIG. 5K.

Using the same masked oxide layer 104, the structure undergoes another ion implantation process for the formation of the source layer 58. As with the previous method, either arsenic (As) or phosphorous (P) can be used as implant material. The implant dosage is preferably $5 \times 10^{15}$ cm$^{-2}$ to $1 \times 10^{16}$ cm$^{-2}$ under an implant potential of between 40 KeV to 100 KeV. Again, to avoid the "channeling effect" of the implanting ion passing through the structure unobstructively, the implanting ion bear should be orientated at an angle with respect to the normal to the major surface 46. The steps of ion-implantation and diffusion are substantially the same as the previous method. For the sake of conciseness, they are not further repeated in here. However, it needs to be pointed out that because of the spacer layer 74 blocking the vertical sidewalls of the steps 86, the body layer 60 of each substrate step 86 will not be impregnated with any boron at the sidewalls. As a consequence, the diffused body layer 60 does not have asymmetrical source regions within the body layer 60. After the diffusion step of the source material, the resultant structure is as shown in FIG. 5L.

Thereafter, the oxide layer 104 is removed. A dielectric layer 66 is formed atop the trenched isolating the conductive material from the source contact metal layer 68. The formation of the dielectric layer, the contact regions 70 and the contact metal layers 68 and 72 are substantially similar as described in the previous method and need no further elaboration in here.

Figure 6:
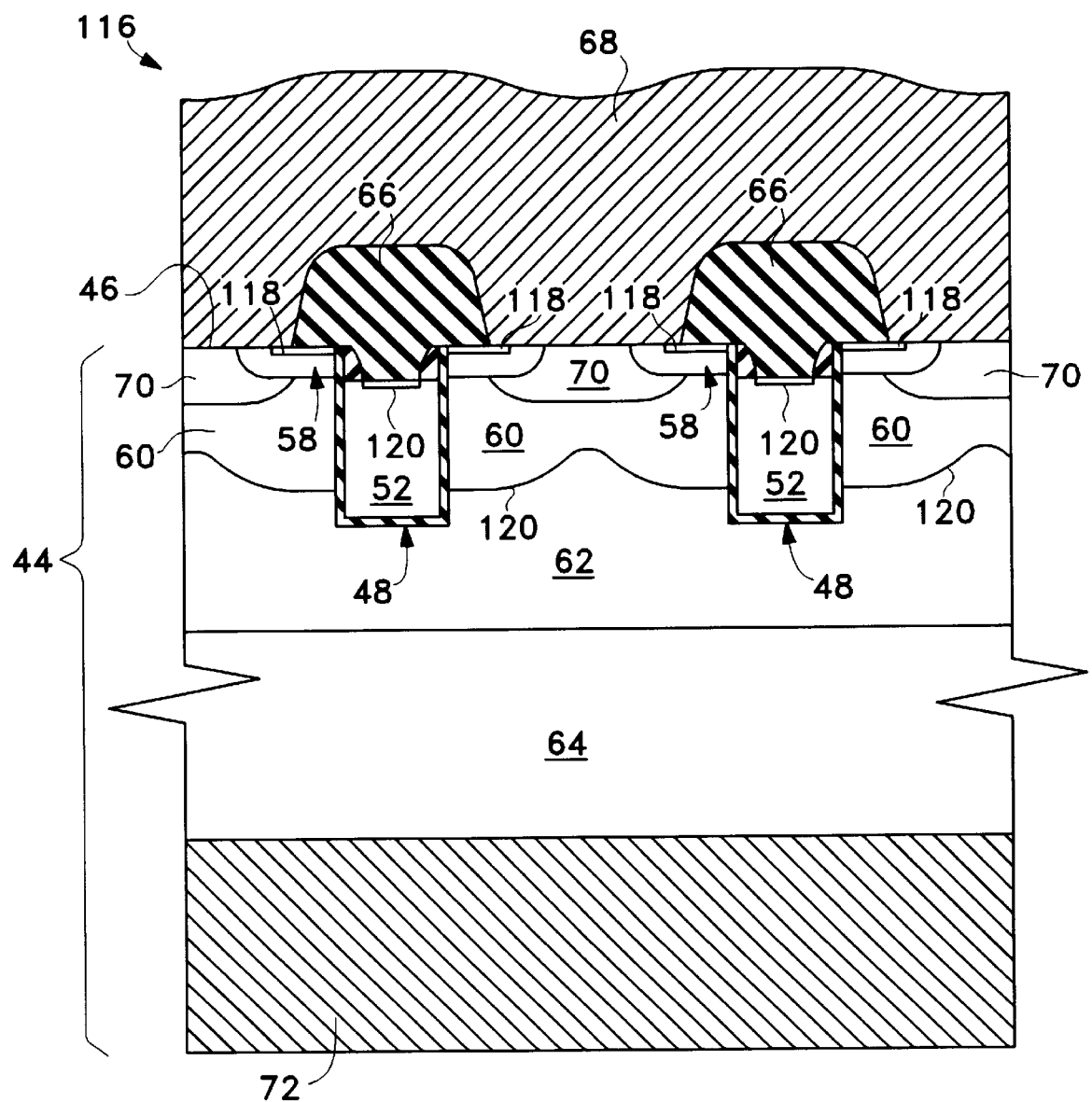
FIG. 6 is a third embodiment of the invention.

FIG. 6 shows the cross-sectional view of the third embodiment of the invention which is signified by the reference numeral 116. The semiconductor structure 116 of this embodiment is substantially the same as that of the second embodiment. The MOSFET structure 116 includes titanium silicide layers 118 and 120 embedded in the source layer 58 and the conductive material 52, respectively. The titanium silicide layers 118 and 120 are highly electrically conductive. As a consequence, the resistance values in both the source layer 58 and the conductive material 52 which serves as the gate of the MOSFET structure 116 are curtailed. Reduction in resistance in the source layer 58 somewhat lowers the turn-on resistance $R_{ON}$ of the MOSFET structure 116. Decrease in resistance in the conductive material 52 residing in the trenches 48 significantly cuts down the resistance-capacitance (RC) time constant of the structure 116 during both the turn-on and turn-off operations. The consequential benefit is that the MOSFET structure 116 is more responsive and capable of operating at high frequency ranges.

FIGS. 6A–6M are sequential views showing the process of making the MOSFET structure 116 of the invention. The process of making structure 116 is substantially similar to the method of making structure 100 described previously. For the sake of conciseness, only the differences are herein highlighted.

Figure 6A:
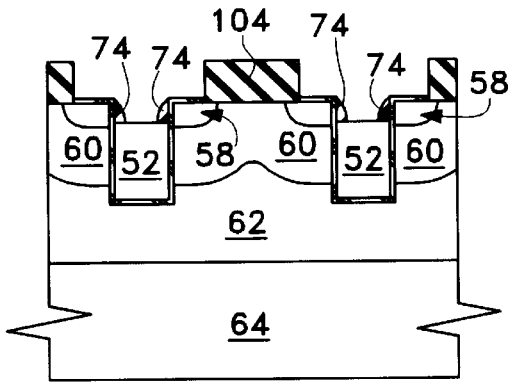
FIGS. 6A–6E are sequential views illustrating the process of making the MOSFET structure as shown in FIG. 6.

After the formation of the source layer 58 and the body layer 62 in a similar manner as depicted above for the fabrication of the semiconductor structure 100 of the second embodiment, the resultant structure is as shown in FIG. 6A.

Figure 6D:
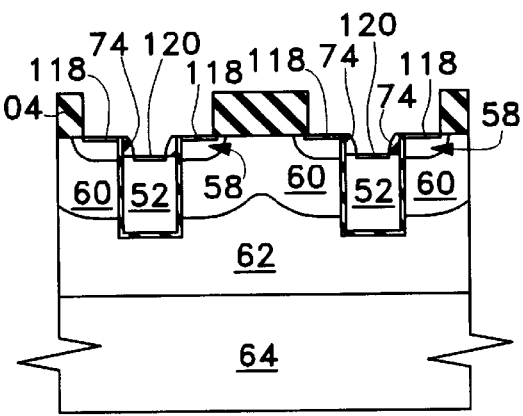
Figure 6B:
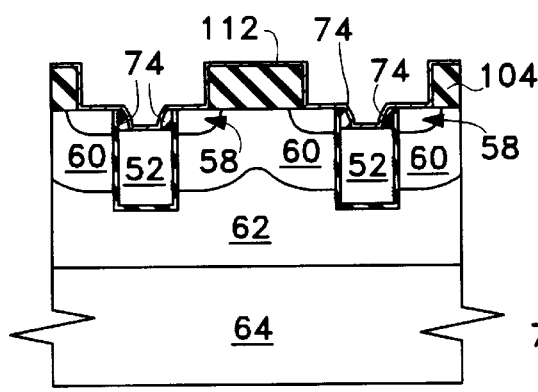
Figure 6E:
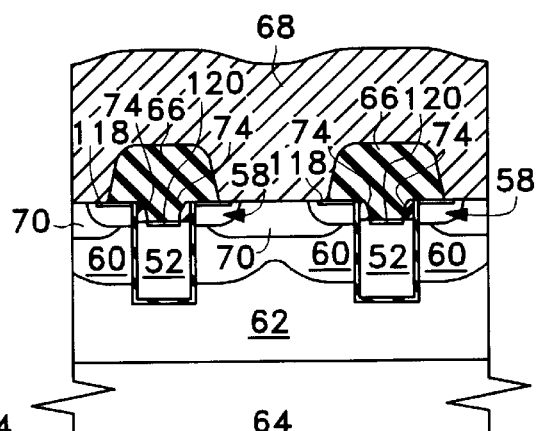
Figure 6C:
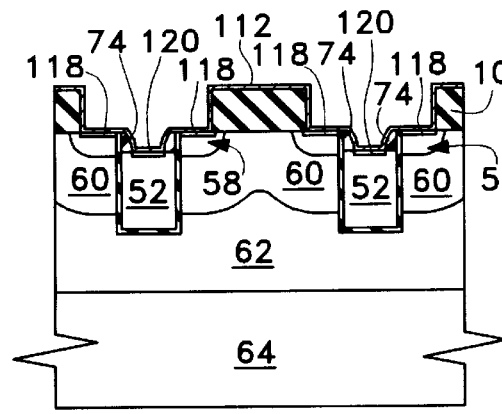

A layer of refractive metal 112 is then deposited onto the structure as shown in FIG. 6B. In this method, the refractive metal used is titanium (Ti). It should be noted that other refractive metals, such as tungsten (W), molybdenum (Mo) or tantalum (Ta), can be used as substitutes. The titanium layer 112 can be deposited by the method of sputtering to a thickness of 1,000 Å–2,000 Å, for example. Thereafter, the entire structure undergoes a rapid thermal anneal (RTA) process within a temperature range of between 550° C.–700° C. Under the RTA process, the refractive metal, titanium in this case, reacts with silicon (Si) to form titanium monosilicide (TiSi) layers which are electrically conductive. Specifically, as shown in FIG. 6C, inside the trenches 48 and above the conductive material 52, a titanium silicide layer 120 is formed. Embedded in the source layer 58, another titanium silicide layer 118 is formed. To further increase the conductivity of the layers 118 and 120, the structure is subjected to another anneal cycle. First, the metallic layer 112 having no reaction with any silicon is removed along with the oxide layer 104. Then, the structure undergoes the anneal cycle at a temperature ranging from 700° C.–1,000° C. Thereafter, the material composition ir the layers 118 and 120 transforms from titanium mono-silicide (TiSi) to titanium silicide (TiSi$_2$) which is highly electrically conductive. The finished structure up to this step is as shown in FIG. 6D.

What follows are the steps of forming the dielectric layer 66, the contact regions 70 and the contact metal layers 68 and 72 in a similar manner as described previously.

Finally, other changes are possible within the scope of the invention. The MOSFET structure 116 of third embodiment 116, with the silicide layers 118 and 120, shown in FIG. 6 and described above, can well be fabricated incorporating the method of making the MOSFET structure 42 of the first embodiment with appropriate modifications. Furthermore, the conductivity types of the layers may very well be different from that as depicted in the specification. In the embodiments described, the semiconductor structures are N-channel MOSFET device. The structures can well be built as P-channel devices with corresponding changes of the fabrication steps. In addition, the device fabricated in accordance with the invention need not be a power MOSFET. It can well be slightly modified and used for other purposes, such as a dynamic random access memory (DRAM) cell, an insulated gate bipolar transistor (IGBT), or a charge-coupled-device (CCD), to name just a few. It will be understood by those skilled in the art that these and other changes in form and detail may be made therein without departing from the scope and spirit of the invention.

What is claimed is:

1. A method of forming a semiconductor structure, comprising the steps of:
   (a) providing a substrate with a major surface;
   (b) forming at least one trench in said substrate extending from said major surface;
   (c) lining said trench with insulating material;
   (d) filling said trench with conductive material;
   (e) forming a spacer layer above said conductive material and surrounding said insulating material adjacent said major surface;
   (f) patterning a masking layer over said substrate; and
   (g) implanting a diffusion layer in said substrate through said masking and spacer layers.

2. The method of forming a semiconductor substrate as set forth in claim 1 wherein said masking layer in step (f) is a second masking layer, step (e) includes the substeps of:
   (i) depositing a first masking layer over said major surface covering said conductive material; and
   (ii) etching said first masking layer such that portions of said first masking layer remain above said conductive material and surrounding said insulating material adjacent said major surface.

3. The method of forming a semiconductor substrate as set forth in claim 1 further comprising the steps of:
   (h) removing said masking layer;
   (i) patterning an insulating layer over said conductive material and said spacer layer; and
   (j) patterning a conductive layer c)ver said substrate and said insulating layer.

4. The method of forming a semiconductor substrate as set forth in claim 1 wherein said layer of masking material in step (f) is formed prior to step (b), and wherein step (g) includes implanting said diffusion layer in said substrate through said masking and spacer layers as a body layer, said method further including implanting a second diffusion layer as a source layer in said substrate through said masking and spacer layers.

5. The method of forming a semiconductor substrate as set forth in claim 1 further including the steps of:
   (h) depositing a refractive material layer over said substrate, said refractive material layer reacts with said conductive material and said diffusion layer to form composite layers; and
   (i) removing said refractive material layer such that selected segments of said composite layers remain over said conductive material and said diffusion layer.

6. The method of forming a semiconductor substrate as set forth in claim 5 further comprising the steps of:
   (j) removing said masking layer;
   (k) patterning an insulating layer over said conductive material and said spacer layer; and
   (l) patterning a conductive layer over said substrate and said insulating layer.

7. The method of forming a semiconductor structure as set forth in claim 5 wherein said refractive material layer includes titanium, said substrate includes silicon, and said composite layers include titanium silicide.

8. The method of forming a semiconductor structure as set forth in claim 1 wherein step (g) includes implanting said diffusion layer in said substrate directing an implant ion beam angularly with respect to the normal to said major surface.

9. A method of forming a cell array, comprising the steps of:
   (a) providing a substrate of a first conductivity type; said substrate includes a major surface;
   (b) forming a plurality of trenches in said substrate extending from said major surface;
   (c) lining said trenches with insulating material;
   (d) filling said trenches with conductive material;
   (e) forming a spacer layer over said conductive material and surrounding said insulating material adjacent said major surface;
   (f) forming a masking layer over said major surface; and
   (g) implanting a source layer of said first conductivity type in said substrate through said masking and spacer layers.

10. The method of forming a semiconductor structure as set forth in claim 9 wherein step (d) includes filling said trenches with conductive material below said major surface thereby exposing steps of said substrate above said conductive material, said masking layer in step (f) is a second masking layer, and step (e) includes the substeps of:
    (i) depositing a first masking layer over said major surface covering said conductive material; and
    (ii) etching said first masking layer such that portions of said first masking layer remain on the sidewalls of said steps as said spacer layer above said conductive material and surrounding said insulating layer.

11. The method of forming a semiconductor substrate as set forth in claim 10 further including the step of forming a body layer of a second conductivity type in said substrate prior to step (e) and wherein step (g) includes implanting said source layer in said body layer.

12. The method of forming a semiconductor structure as set forth in claim 11 wherein step (g) includes implanting said diffusion layer in said substrate by directing an implant ion beam angularly with respect to the normal of said major surface.

13. The method of forming a semiconductor substrate as set forth in claim 12 further comprising the steps of:
    (h) removing said second masking layer;
    (i) patterning an insulating layer over said conductive material and said spacer layer; and
    (j) patterning a conductive layer over said substrate and said insulating layer.

14. The method of forming a semiconductor substrate as set forth in claim 10 wherein said second masking layer in step (f) is formed prior to step (b), and wherein said method further including the step of implanting a body layer of a second conductivity type in said substrate through said masking and spacer layers and thereafter diffusing said body layer downward and sideward in said substrate prior to step (g).

15. The method of forming a semiconductor substrate as set forth in claim 14 further comprising the steps of:
    (h) removing said second masking layer;
    (i) patterning an insulating layer over said conductive material and said spacer layer; and
    (j) patterning a conductive layer over said substrate and said insulating layer.

16. The method of forming a semiconductor substrate as set forth in claim 14 further including the steps of:
  (h) depositing a refractive material layer over said substrate, said refractive material layer reacts with said conductive material and said diffusion layer to form composite layers; and
  (i) removing said refractive material layer such that selected segments of said composite layers remain over said conductive material and said diffusion layer.

17. The method of forming a semiconductor substrate as set forth in claim 16 further comprising the steps of:
  (j) removing said second masking layer;
  (k) patterning an insulating layer over said conductive material and said spacer layer; and
  (l) patterning a conductive layer over said substrate and said insulating layer.

18. The method of forming a semiconductor structure as set forth in claim 17 wherein said refractive material layer includes titanium, said substrate includes silicon, and said composite layers include titanium silicide.

19. A method for forming a semiconductor structure, comprising the step of:
  (a) providing a substrate having a major surface;
  (b) patterning a first masking layer over said substrate;
  (c) forming at least one trench in said substrate extending beyond said major surface;
  (d) lining said at least one trench with insulating material;
  (e) filling said at least one trench with conductive material;
  (f) forming a spacer layer above said conductive material and surrounding said insulting material adjacent said major surface;
  (g) implanting a body layer in said substrate through said masking and spacer layers;
  (h) diffusing said body layer downwardly and sidewardly so as to merge portions of said body layer under said masking and spacer layers together; and
  (i) implanting a source layer in said substrate through said masking and spacer layers.

20. The method of forming a semiconductor substrate as set forth in claim 19 further including the steps of:
  (j) depositing a refractive material layer over said substrate, said refractive material layer reacts with said conductive material and said source layer to form composite layers; and
  (k) removing said refractive material layer such that selected segments of said composite layers remain over said conductive material and said source layer.

21. The method of forming a semiconductor structure as set forth in claim 20 wherein said refractive material includes titanium, said substrate includes silicon, and said composite layers include titanium silicide.

* * * * *